United States Patent [19]

Franciosi

[11] Patent Number: 4,684,541
[45] Date of Patent: Aug. 4, 1987

[54] SAMARIUM-PROMOTED OXIDATION OF SILICON AND GALLIUM ARSENIDE SURFACES

[75] Inventor: Alfonso Franciosi, Eden Prairie, Minn.

[73] Assignee: Regents of the University of Minnesota, Minneapolis, Minn.

[21] Appl. No.: 872,889

[22] Filed: Jun. 11, 1986

[51] Int. Cl.[4] .............................................. B05D 5/12
[52] U.S. Cl. ..................................... 437/173; 437/225
[58] Field of Search ..................................... 427/82, 93

[56] References Cited

PUBLICATIONS

F. U. Hillebrecht et al., Enhancement of Si Oxidation by Ce Overlayers, Brookhaven National Laboratory Internal Report (1986).

Primary Examiner—Sam Silverberg
Attorney, Agent, or Firm—Merchant, Gould, Smith, Edell, Welter & Schmidt

[57] ABSTRACT

A method is provided for the oxidation of a silicon or gallium arsenide surface by depositing thereon a samarium overlayer comprising trivalent samarium prior to exposure of the surface to an oxidizing atmosphere.

5 Claims, 4 Drawing Figures

SAMARIUM-PROMOTED OXIDATION OF SILICON AND GALLIUM ARSENIDE SURFACES

BACKGROUND OF THE INVENTION

This invention was made with the support of the Office of Naval Research under Contract No. N00014-84-K-0545. The Government has certain rights in this invention.

The oxidation of silicon, germanium and gallium arsenide is necessary for fabrication of modern integrated circuits. The production of high quality integrated circuits requires the ability to form oxide-coated layers in a controlled and repeatable manner. The resultant oxide layers can serve as masks against implant or diffusion of the dopant into the underlying bodies, can provide surface passivation, can isolate one device from another, can act as components in the semiconductor structures, or can provide electrical isolation of multi-level metalization systems. Several techniques for forming such oxide layers have been developed, including thermal oxidation, wet anodization, chemical vapor deposition and plasma anodization.

Attempts to promote semiconductor surface oxidation reactions have involved the deposition of a layer of a catalyst onto the surface, followed by reaction of the treated surface with a gaseous oxygen to yield a stoichrometic insulating oxide which may or may not include the catalyst. For example, a number of metal overlayers on silicon effect an increase in the oxidation rate when the surface is exposed to an oxidizing atmosphere. Metals such as gold, silver, cesium, aluminum, copper, palladium and chromium have been disclosed to give rise to oxidation promotion with the production of silicon oxide phases of variable stoichiometry. To the extent that the metal atoms increase the surface reaction kinetics and do not become directly involved in the oxide reaction product, they act as catalysts. Since the magnitude of the observed effects depend on the overlayer-silicon interface morphology, these phenomena can be referred to as interface catalytic effects. Therefore, metals with similar chemistry can give rise to quantitatively different promotion effects, as can overlayers which exhibit similar morphology but which differ in chemical composition.

Therefore, a need exists for catalytic methods to promote the formation of stable oxide layers on silicon and gallium arsenide surfaces. Such oxide layers can exhibit inversion and accumulation characteristics suitable for metal oxide semiconductor (MOS) device fabrication.

BRIEF DESCRIPTION OF THE INVENTION

The present invention is directed to a method for catalyzing the oxidation of a silicon (Si) or a gallim arsenide (GaAs) surface comprising depositing an overlayer of samarium (Sm) thereon prior to the exposure of the surface to an oxidizing atmosphere. This overlayer comprises trivalent ($Sm^{+3}$) samarium and gives rise to an oxidation promotion effect of an unexpected and unprecedented magnitude. At overlayer thicknesses of at least one monolayer (about 2–3 Å), trivalent Sm species predominate over divalent Sm species and result in a strong surface-Sm interaction. This interaction substantially promotes the oxidation of the overlayered surface at oxygen exposures of as low as about 10–100 L (Langmuirs). This effect is observed until the thickness of the Sm overlayer exceeds about 20–25 Å, at which point metallic samarium is predominant in the layer, and the formation of the extended Si-Sm interface has been completed. Likewise, the oxidation promotion effect observed at submonolayer Sm coverage is relatively minor, and may be due to the presence of a small $Sm^{+3}$ contribution. The Sm present in the submonolayer is apparently primarily $Sm^{+2}$.

Although the present method is described primarily by reference to examples involving the oxidation of Sm layers on GaAs(110) and Si(111) single crystal surfaces, it is expected that the oxidation of Si and GaAs crystal planes of other orientations such as Si(311), Si(100), Si(110), GaAs(100), GaAs(111) and GaAs(311) will also be catalyzed by this method. Following deposition of the Sm overlayer, oxidation can be continued until an oxide layer of the desired final thickness is formed.

DETAILED DESCRIPTION OF THE INVENTION

Samarium chemisorption on Si, Ge and GaAs apparently proceeds in two stages, with a transition between a "weak chemisorption" overlayer, where Sm is mainly in divalent form and there is little evidence of metal-semiconductor interdiffusion, to a "reactive" overlayer, where the Sm is predominantly trivalent. In the "reactive layer" silicide-like interface species are formed and the large core chemical shifts which can be observed suggest a significant ionic contribution to the Si-metal bonding. The transition between the two overlayer types occurs at a coverage of about one monolayer (2–3 Å), and the reactive overlayer is maintained until an overlayer thickness of about 20–25 Å is attained. This reactive overlayer provides extremely effective oxidation promotion effects both on Si(111) and GaAs(110) surfaces which are associated with the presence therein of $Sm^{+3}$ species.

The invention will be further described by reference to the following detailed example, which describes work carried out at the Synchrotron Radiation Center of the University of Wisconsin-Madison. Radiation from the 240 MeV electron storage ring Tantalus was monochromatized by a "grasshopper" grazing incidence monochromator and focused inside our photoelectron spectrometer (operating pressure $<5\times10^{-11}$ torr).

Si(111)2×1 and GaAs(110)1×1 surfaces were obtained by cleavage in situ, and Sm overlayers were deposited from a W-coil evaporator at pressure $<2\times10^{-10}$ torr, with overlayer thickness measured by a quartz thickness monitor.

Exposure to oxygen was performed in the $10^{-7}$–$10^{-5}$ torr range with pressure monitored by a low-emission ion gauge that was not directly in line-of-sight of the sample surface. Also, ion pumps were isolated from the spectrometer during exposure, and the system was pumped down in the $10^{-9}$ torr range with a cryopanel prior to opening to the ion pump. Oxygen chemisorption studies on free Si(111) and GaAs(110) surfaces under the same conditions were also carried out. Promotion effects due to the overlayer are measured by comparison with the results obtained when the uncoated surface was exposed to oxygen.

Photoelectrons were collected and analyzed in angular-integrated energy distribution curves (EDC's) with a commercial hemispherical analyzer with overall resolution (electrons+photons) of 0.25–0.40 eV. EDC's for the Si 2p, Ga 3d and As 3d core emission are depicted in FIGS. 1-4 after subtraction of a smooth secondary background. All binding energies are referred to the Fermi level $E_F$, determined by deposition of a thick Cr film on selected cleaves and direct measurement of the 3d Fermi cutoff.

EXAMPLE

Deposition of Sm layers on Silicon and Gallium Arsenide

A. Sm Deposition on Si(111)

Figure 1:
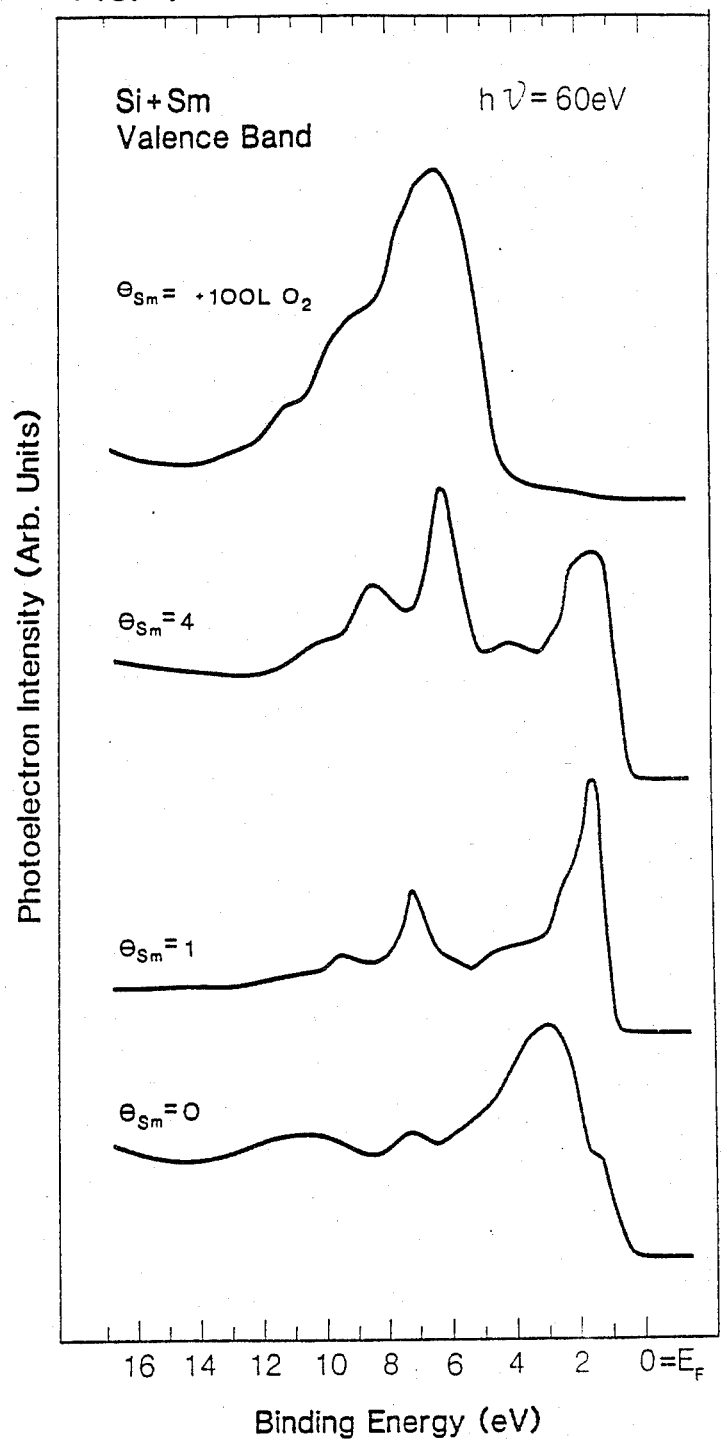
FIG. 1 is a graphical depiction of the valence band emission for Si surfaces treated in accord with the present method.

FIG. 1 depicts representative EDC's for the valence band emission at an hγ of 60 eV from Sm overlayers on Si(111). The spectra are approximately normalized to the main emission feature and are given in arbitrary units. The bottom-most EDC is for clean Si((111), while the spectra at metal coverages (θ) of 1 Å and 4 Å are representative of two different interface morphologies.

In the submonolayer coverage range (1 Å) most of the Sm atoms are in a divalent "weakly chemisorbed" state so that $Sm^{+2}$ 4f features visible within 4 eV of $E_F$ dominate the spectrum. At Sm coverages above a monolayer (4 Å), trivalent Sm species dominate, giving rise to a characteristic $Sm^{+3}$ multiplet between 4 and 10 eV below $E_F$. Exposure to 100 L of oxygen (topmost EDC θ=4 +100LO₂) yields a dramatic modification of the valence EDC, which appears dominated by a strong 0 2p signal with some residual $Sm^{+3}$ emission.

Figure 2:
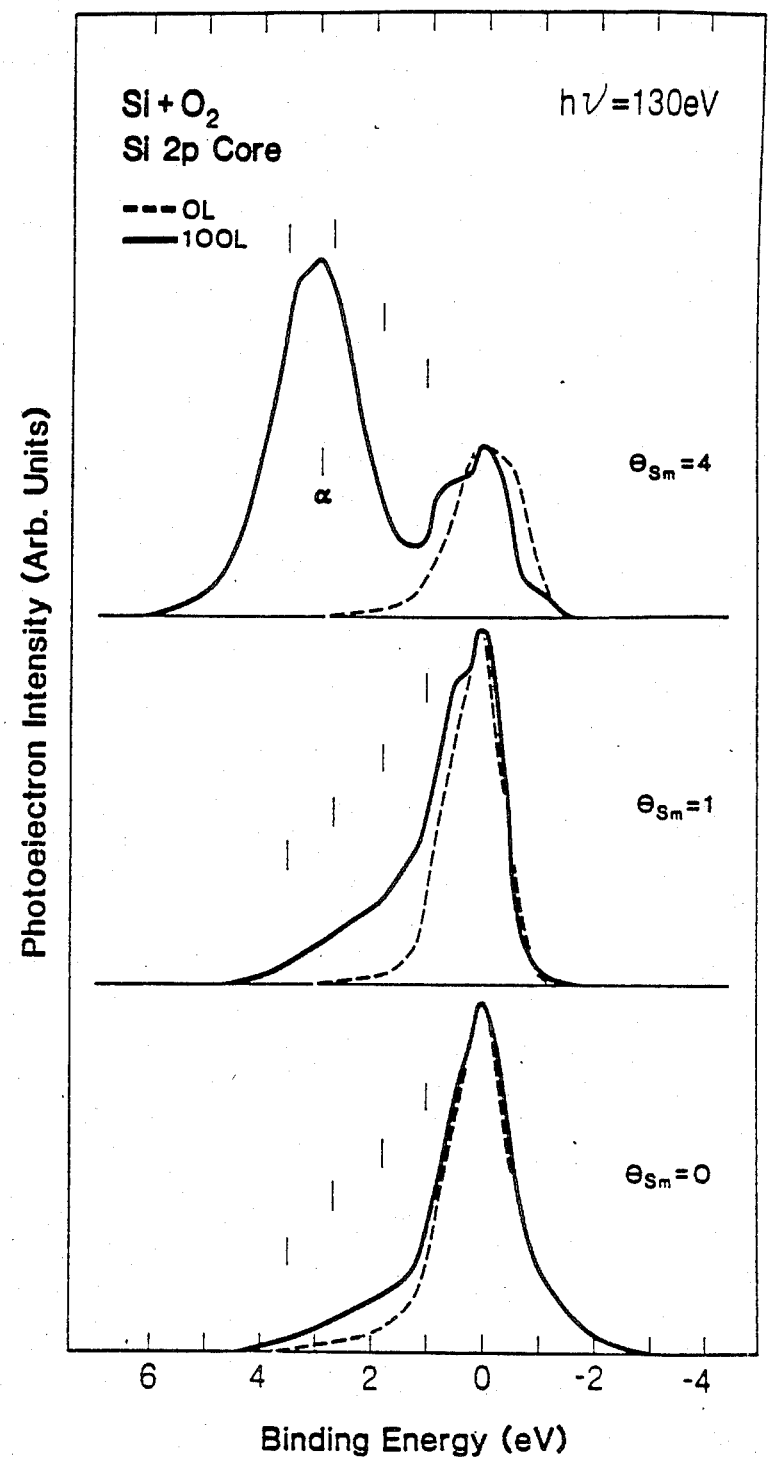
FIG. 2 is a graphical depiction of the Si 2p core emission for Si surfaces treated in accord with the present method.

Correspondingly, the Si 2p core level emission provides evidence of a strong Sm-Si reaction. FIG. 2 depicts representative EDC's for the Si 2p core emission before (dashed line) and after (solid line) exposure to 100 L of oxygen. The EDC's have been shifted rigidly when necessary to suppress small band bending variations and they have been arbitrarily normalized to the Si 2p feature at the initial "substrate" position to emphasize lineshape changes.

The bottom-most EDC shows the effect of oxygen exposure on the Si 2p emission when no Sm overlayer is present. The small oxide-induced features 1-3 eV below the main line are consistent with the relatively low oxygen saturation coverage obtainable on the clean Si(111) surface. The vertical bars in FIG. 2 at 0.9, 1.8, 2.6 and 3.5 eV mark the position of the chemically-shifted Si 2p contributions associated by Hollinger and Himpsel [*Phys. Rev.*, B28, 3651 (1983)] with Si atoms bonded to 1, 2, 3 and 4 oxygen atoms, respectively. Vertical bar α in the top section of FIG. 2 marks the position of the dominant Si 2p oxide feature which has been observed to be associated with the oxidation of amorphous silicon.

At submonolayer Sm coverage ($\theta_{Sm}$ =1 Å) the unoxidized Si 2p EDC (dashed line) is very similar to the bottom EDC, because of the low extent of Si-Sm interaction. Upon oxidation, increased emission is observed on the high binding energy side of the Si 2p cores (solid line), suggesting only limited oxide formation and low Si oxidation states.

For Sm coverages above one monolayer in thickness (top-most EDC), the unoxidized EDC (dashed line) is broadened by the presence of a low binding energy Si 2p component that is the result of the formation of a silicide-like reaction product. Upon oxidation, a dominant Si oxide feature appears where high oxidation states of Si dominate.

The magnitude of the oxidation promotion effect at this overlayer thickness and at oxygen exposures of only 10-100 L is unprecedented within the series of metal overlayers which have been previously investigated. The residual Si 2p emission near the zero of the energy scale appears dominated by a low binding energy oxide feature near 0.75 eV and some residual Si 2p substrate emission, while relatively little is left of the silicide-like emission feature. If higher oxygen exposures are used, the oxide features are further increased relative to the substrate contribution and no saturation is observed up to 100 L exposure.

The strong promotion effect phenomenologically corresponds to the presence of trivalent Sm in an intermixed Si-Sm interface region. The oxidation promotion effect observed at submonolayer metal coverage ($\theta_{Sm}$=1 Å) is relatively minor. This effect may be explained by the presence of a small $Sm^{+3}$ contribution even at submonolayer coverage, indicating some inhomogeneities in the thickness of Sm overlayer.

B. Sm Deposition on GaAs(110)

Figure 3:
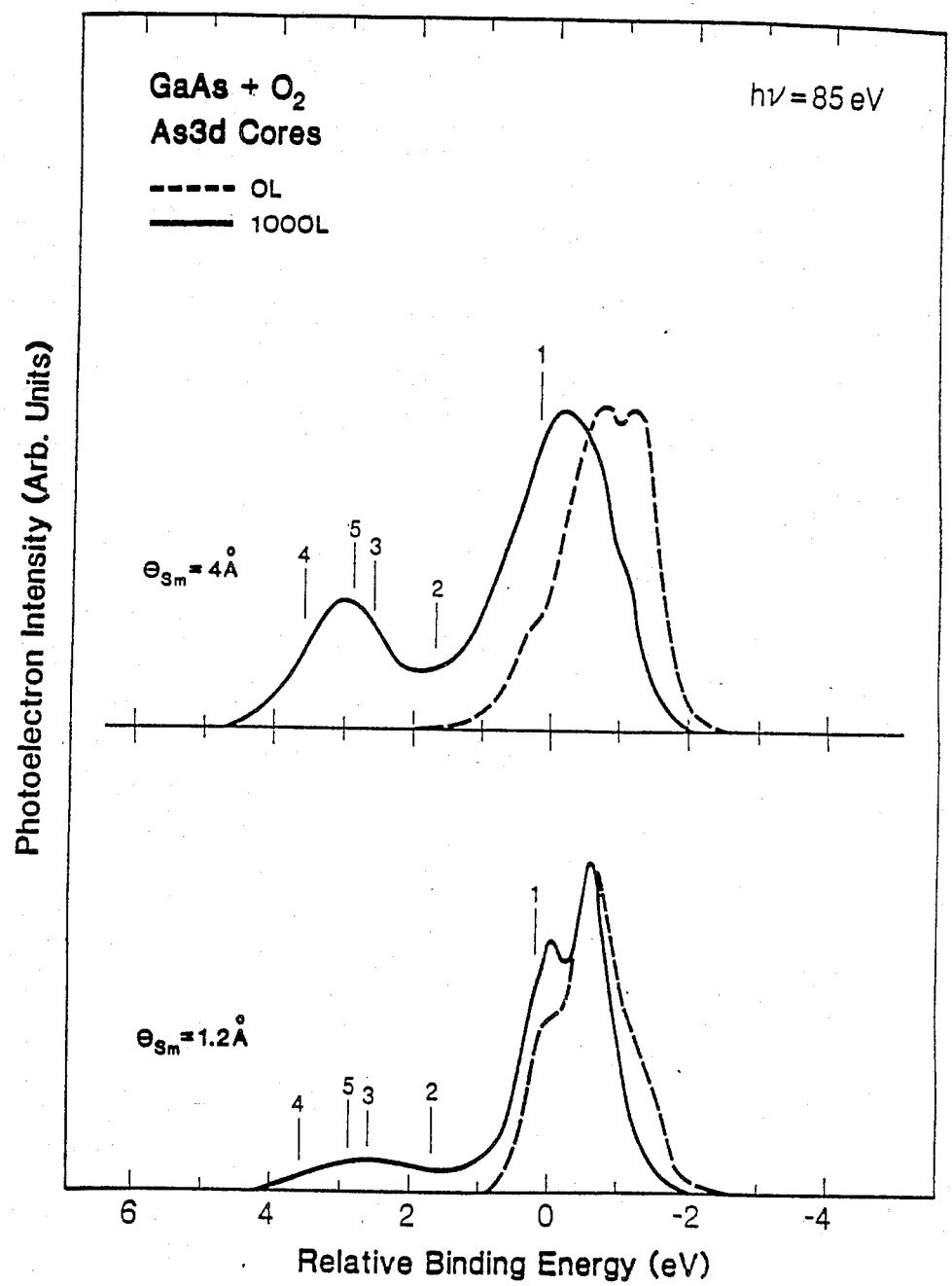
FIG. 3 is a graphical depiction of the As 3d core emission from GaAs surfaces treated in accord with the present method.
Figure 4:
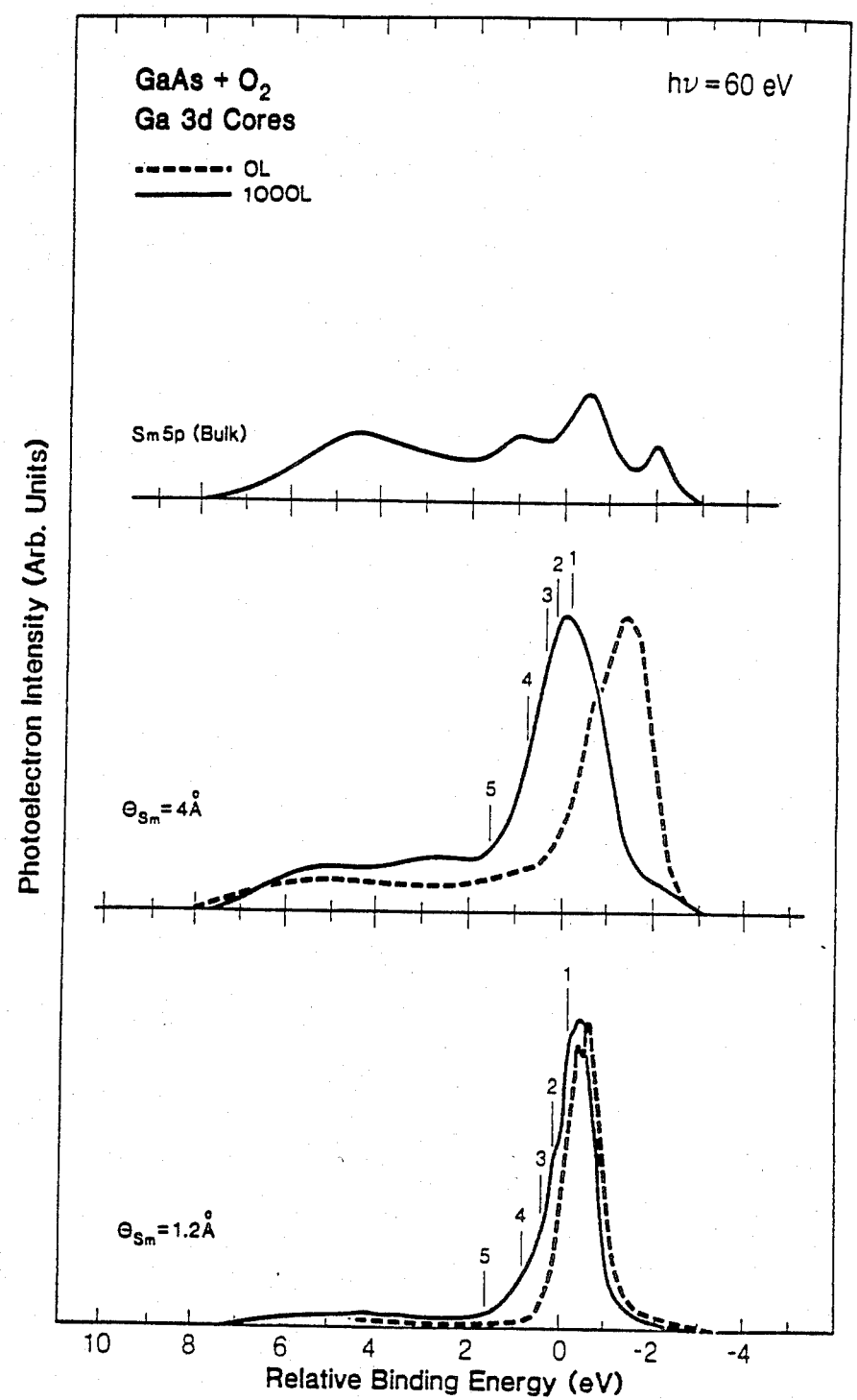
FIG. 4 is a graphical depiction of the Ga 3d core emission from samples which provided the As core results depicted in FIG. 3.

Analogous results were confirmed by the data shown in FIGS. 3-4 for GaAs. The As 3d and Ga 3d core emissions are shown normalized to the main emission feature after subtraction of the secondary background. The zero of the binding energy scale corresponds to the initial core binding energy for the clean surface in flat-band conditions. The bottom-most EDC is representative of submonolayer coverage where divalent Sm species dominate. EDC at $\theta_{Sm}$=4 Å are representative of the coverage range where $Sm^{+3}$ species become dominant. The spectra are shown before (dashed line) and after (solid line) exposure to 1000 L of oxygen.

The EDC's derived from unoxidized samples indicate that the result of increasing the Sm deposition is the emergence of a low binding energy component at about −1.2 eV in the As 3d lineshape, a feature associated with the formation of As-Sm arsenide-like species in the interface region (FIG. 3).

For the Ga 3d line, the discussion is complicated by superposition with the Sm 5p feature. For comparison, the top section of FIG. 4 depicts a plot of a representative EDC for the 5p core emission from a thick (450 Å) Sm film deposited on oxidized Ta. The 5p line was rigidly shifted to align it with the 5p contribution in the interface spectra. A deconvolution of the Ga 3d and Sm 5p lines was not attempted, since the complex 5p lineshape reflects the mixed valence character of Sm and the 5p-4f multiplet coupling, and is therefore coverage-dependent in the interface spectra.

The dashed-line EDC's in FIG. 4 show clearly the emergence of a broad low binding energy Ga 3d contribution as a result of increasing Sm deposition. This contribution has been associated with the formation of an Sm-Ga intermediate phase. Upon exposure to 1000 L of oxygen, at submonolayer Sm coverage, little oxidation effect is seen in FIG. 4, while at θ=4 Å most Ga atoms within the experimental sampling depth appear oxidized, giving rise to a relatively broad, high binding energy feature, with no residual emission from the alloyed phase.

The vertical bars 1-4 mark the position of Ga 3d features observed by Landgren et al., *Sci. Technol.*, B2, 351 (1984), during oxidation of GaAs, and vertical bar 5 marks the position of the Ga 3d core level observed in $Ga_2O_3$ by Su et al., *Surf. Sci.*, 118, 248 (1982). The broad oxidized feature in the mid-section of FIG. 4 is similar to the one observed in other overlayer-activated oxidation processes and corresponds to several nonequivalent oxidation states for Ga within the sampling depth.

As depicted in FIG. 3, the effect of oxygen exposure on the As 3d core emission is more complex. The EDC shown in the lower section of FIG. 3 indicates that at submonolayer coverage, when most Sm atoms are divalent, oxygen exposure gives rise to a broad emission band between 1 and 4 eV. A minor oxidized feature that emerges near the zero of the energy scale appears related to a small $Sm^{+3}$ contribution visible also in the valence spectra. This contribution also accounts for a shoulder near $-1.2$ eV in the dashed-line spectrum in the lower section of FIG. 3. For $\theta = 4$ Å, aresenide-like species involving $Sm^{+3}$ atoms are observed as a major emission feature near $-1.2$ eV, and oxygen exposure gives rise to two well-defined oxidized features: a broad dominant line near the zero of the energy scale, and a high binding energy feature near 3 eV. This latter feature is clearly related to the feature observed at submonolayer Sm coverage. Vertical bars 1-4 in FIG. 3 indicate the position of As 3d features observed by Landgren et al., supra, 0.8, 2.3, 3.2 and 4.2 below the initial substrate As 3d binding energy, and associated by these authors with the presence of As coordinated with one, two, three and four oxygen atoms, respectively. Vertical bar 5 corresponds to the position of the As 3d core level observed in $As_2O_3$ by Su et al, supra.

The data summarized in FIG. 3 indicate that strong oxidation promotion effects yield the formation of oxidized As species with low-oxidation states and a second phase with higher stability (possibly similar to $As_2O_3$). The formation of the first oxidized species is related to the presence of $Sm^{+3}$ in the Sm-As interface reaction products, while the second species may be related to some catalytic activity of the divalent Sm overlayer weakly interacting with the GaAs substrate. No saturation of oxygen uptake is observed to exposures to up to $10^3$ L.

SUMMARY

In conclusion, the present invention provides thin Sm overlayers which act as powerful promoters of the oxidation reaction on both Si(111) and GaAs(110) surfaces. The low electronegativity of samarium is certainly not adequate to explain these oxidation promotion effects, since these results indicate that trivalent Sm atoms strongly bonded with Si at least in part ionically exhibit higher specific activity than divalent Sm overlayers. On the basis of sheer electrostatic considerations, one could have expected an opposite trend, i.e., a higher electro-positive situation for Sm atoms in the trivalent state.

Two factors that may play an important role are interface morphology and the formation of intermediate reaction products. Since trivalent Sm species are "dispersed" in an intermixed Si-Sm interface region, they may play the role of a dispersed catalyst occupying "active" surface sites that were not available in the submonolayer, divalent chemisorption layer. Alternatively, the oxidation reaction may take place via intermediate Sm compounds where Sm is in a trivalent state, such as a hypothetical $Sm_2O_3$ surface oxide.

The invention has been described with reference to various specific and preferred embodiments and techniques. However, it should be understood that many variations and modifications may be made while remaining within the spirit and scope of the invention.

What is claimed is:

1. A method for promoting oxidation of a silicon or gallium arsenide surface comprising: depositing a samarium overlayer 2-25 Å in thickness, which comprises trivalent samarium on said silicon or gallium arsenide surface prior to the oxidation of said surface oxidizing said surface.

2. The method of claim 1 wherein said surface is a single crystal surface selected from the group consisting of silicon(100), silicon(110) or silicon(111).

3. The method of claim 1 wherein said surface is a single crystal surface selected from the group consisting of gallium arsenide(100), gallium arsenide(110) or gallium arsenide(111).

4. The method of claim 1 wherein the samarium overlayer is at least about 2-3 Å in thickness.

5. The method of claim 5 wherein the samarium overlayer is about 3-20 Å in thickness.

* * * * *

UNITED STATES PATENT AND TRADEMARK OFFICE
CERTIFICATE OF CORRECTION

PATENT NO. : 4,684,541

DATED : August 4, 1987

INVENTOR(S) : Alfonso Franciosi

It is certified that error appears in the above-identified patent and that said Letters Patent is hereby corrected as shown below:

At Col. 1, line 54, for "gallim" read --gallium--.

At Col. 4, line 65, for "intermediate" read --intermetallic--.

Signed and Sealed this

Twelfth Day of April, 1988

Attest:

DONALD J. QUIGG

Attesting Officer

Commissioner of Patents and Trademarks